(12) United States Patent
Roh

(10) Patent No.: US 8,877,557 B2
(45) Date of Patent: Nov. 4, 2014

(54) METHOD OF MANUFACTURING ORGANIC LIGHT EMITTING DISPLAY DEVICE

(71) Applicant: Samsung Display Co., Ltd., Yongin-si (KR)

(72) Inventor: Geum Jong Roh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/715,964

(22) Filed: Dec. 14, 2012

(65) Prior Publication Data

US 2014/0011312 A1 Jan. 9, 2014

(30) Foreign Application Priority Data

Jul. 5, 2012 (KR) .................. 10-2012-0073559

(51) Int. Cl.
| | |
|---|---|
| *H01L 21/00* | (2006.01) |
| *H01L 51/00* | (2006.01) |
| *C23C 14/12* | (2006.01) |
| *C23C 14/24* | (2006.01) |
| *C23C 14/32* | (2006.01) |
| *C23C 14/04* | (2006.01) |
| *H01L 27/32* | (2006.01) |
| *H01L 51/56* | (2006.01) |

(52) U.S. Cl.
CPC ......... *H01L 51/0008* (2013.01); *H01L 27/3211* (2013.01); *C23C 14/12* (2013.01); *C23C 14/243* (2013.01); *H01L 51/56* (2013.01); *C23C 14/32* (2013.01); *C23C 14/04* (2013.01)
USPC ....................................... 438/116

(58) Field of Classification Search
CPC ................ H01L 51/008; H01L 27/3248

USPC .......... 438/46, 116, 99; 257/59, 72, E29.151, 257/E29.202
See application file for complete search history.

(56) References Cited

U.S. PATENT DOCUMENTS

| | | | |
|---|---|---|---|
| 2007/0063644 A1 | 3/2007 | Kim | |
| 2008/0087629 A1* | 4/2008 | Shimomura et al. | ............ 216/11 |

FOREIGN PATENT DOCUMENTS

| | | |
|---|---|---|
| JP | 2001-345177 | 12/2001 |
| KR | 10-2005-0084579 | 8/2005 |
| KR | 10-0745346 | 8/2007 |

OTHER PUBLICATIONS

Korean Patent Abstract 1020070032872 A dated Mar. 23, 2007 for Korean Patent 10-0745346 listed above.

* cited by examiner

*Primary Examiner* — Jarrett Stark
*Assistant Examiner* — Shahed Ahmed
(74) *Attorney, Agent, or Firm* — Christie, Parker & Hale, LLP

(57) ABSTRACT

An organic light emitting display device is manufactured by: preparing a target substrate that includes sub-pixel areas (each having a thin film transistor) and pixel defining areas (each having a conductive layer) between the sub-pixel areas; preparing an ionized deposition material by vaporizing and ionizing a deposition material; applying a ground voltage to one of the sub-pixel areas while applying a voltage having a same polarity as the ionized deposition material to the neighboring ones of the sub-pixel areas and to the pixel defining areas; and depositing the ionized deposition material on the one of the sub-pixel areas to form an organic thin layer while the one of the sub-pixel areas is polarized by an electric field generated by the voltage being applied to the conductive layer of the pixel defining areas.

8 Claims, 8 Drawing Sheets

METHOD OF MANUFACTURING ORGANIC LIGHT EMITTING DISPLAY DEVICE

CROSS-REFERENCE TO RELATED APPLICATION

This application claims priority to and the benefit of Korean Patent Application No. 10-2012-0073559, filed on Jul. 5, 2012 in the Korean Intellectual Property Office, the entire content of which is herein incorporated by reference.

BACKGROUND

1. Field

Aspects of embodiments of the present invention relate generally to a method of manufacturing an organic light emitting display device.

2. Description of the Related Art

In an organic light emitting display device, holes and electrons are injected into an emitting layer through an anode and a cathode, and are recombined in the emitting layer to generate excitons. The excitons emit energy, discharged when an excited state returns to a ground state, as light. The emitting layer of the organic light emitting display device includes an organic thin layer. The organic thin layer is formed by various methods. For instance, the organic thin layer can be formed by a physical vapor deposition method (e.g., an evaporation-deposition method), an ion-plating method, a sputtering method, a chemical vapor deposition method using a gas reaction, etc. However, the organic thin layer formed by the above-mentioned methods generally has a non-uniform thickness.

SUMMARY

Embodiments of the present invention provide for a method of manufacturing an organic light emitting display device that forms an organic thin layer with substantially uniform thickness.

According to an exemplary embodiment of the present invention, a method of manufacturing an organic light emitting display device is provided. The method includes preparing a target substrate. The target substrate includes a plurality of sub-pixel areas. Each of the sub-pixel areas includes a thin film transistor having a gate electrode, a first wiring electrically connected to the gate electrode, and a pixel electrode connected to the thin film transistor. The target substrate also includes a plurality of pixel defining areas between the sub-pixel areas. Each of the sub-pixel areas includes a pixel definition layer, a conductive layer on the pixel definition layer, and a second wiring electrically connected to the conductive layer. The method further includes preparing an ionized deposition material by vaporizing and ionizing a deposition material; applying a ground voltage to the first wiring of one of the sub-pixel areas while applying a voltage having a same polarity as the ionized deposition material to the first wiring of neighboring ones of the sub-pixel areas and to the second wiring of the pixel defining areas, and depositing the ionized deposition material on the pixel electrode of the one of the sub-pixel areas to form an organic thin layer while the pixel electrode of the one of the sub-pixel areas is polarized by an electric field generated by the voltage being applied to the conductive layer of the pixel defining areas.

The depositing of the ionized deposition material may include: depositing a first portion of the ionized deposition material on a center area of the pixel electrode of the one of the sub-pixel areas by using a repulsive force acting between the ionized deposition material and the conductive layer; depositing a second portion of the ionized deposition material on an area between the deposited first portion and an edge area of the pixel electrode of the one of the sub-pixel areas by using the repulsive force acting between the ionized deposition material and the conductive layer, and a repulsive force acting between the ionized deposition material and the deposited first portion; and depositing a third portion of the ionized deposition material on an area between the deposited second portion and the edge area of the pixel electrode of the one of the sub-pixel areas, and on an area between the deposited first portion and the deposited second portion using repulsive forces acting between the ionized deposition material and the deposited first portion, the deposited second portion, and the conductive layer.

The sub-pixel areas may include a red sub-pixel area, a green sub-pixel area, and a blue sub-pixel area. The one of the sub-pixel areas may include one of the red sub-pixel area, the green sub-pixel area, or the blue sub-pixel area.

The method may further include removing the conductive layer after the organic thin layer is formed.

According to another exemplary embodiment of the present invention, a method of manufacturing an organic light emitting display device is provided. The method includes: preparing a target substrate that includes a plurality of sub-pixel areas and a conductive layer between the sub-pixel areas; applying a first voltage to one of the sub-pixel areas while applying a second voltage different from the first voltage to neighboring ones of the sub-pixel areas and to the conductive layer, to generate an electric field to polarize the one of the sub-pixel areas; and depositing an ionized deposition material having a same polarity as the second voltage on the one of the sub-pixel areas to form an organic thin layer. The depositing of the ionized deposition material includes: depositing a first portion of the ionized deposition material on a center area of the one of the sub-pixel areas using a repulsive force acting between the ionized deposition material and the conductive layer; depositing a second portion of the ionized deposition material on an area between the deposited first portion and an edge area of the one of the sub-pixel areas by using the repulsive force acting between the ionized deposition material and the conductive layer, and a repulsive force acting between the ionized deposition material and the deposited first portion; and depositing a third portion of the ionized deposition material on an area between the deposited second portion and the edge area of the one of the sub-pixel areas, and on an area between the deposited first portion and the deposited second portion using repulsive forces acting between the ionized deposition material and the deposited first portion, the deposited second portion, and the conductive layer.

The first voltage may be a ground voltage.

Each of the sub-pixel areas may include a thin film transistor having a gate electrode, and a pixel electrode connected to the thin film transistor. The applying of the first voltage to the one of the sub-pixel areas may include applying the first voltage to the gate electrode of the thin film transistor in the one of the sub-pixel areas. The applying of the second voltage to the neighboring ones of the sub-pixel areas may include applying the second voltage to the gate electrode of the thin film transistor in each of the neighboring sub-pixel areas.

The sub-pixel areas may be defined by a pixel definition layer. The conductive layer may be on the pixel definition layer.

The method may further include removing the conductive layer after the organic thin layer is formed.

The above and other embodiments provide for a method of manufacturing an organic light emitting display device that forms an organic thin layer having a uniform (or substantially uniform) thickness.

BRIEF DESCRIPTION OF THE DRAWINGS

The above and other aspects of the present invention will become more readily apparent by reference to the following detailed description when considered in conjunction with the accompanying drawings in which.

DETAILED DESCRIPTION

Figure 1:
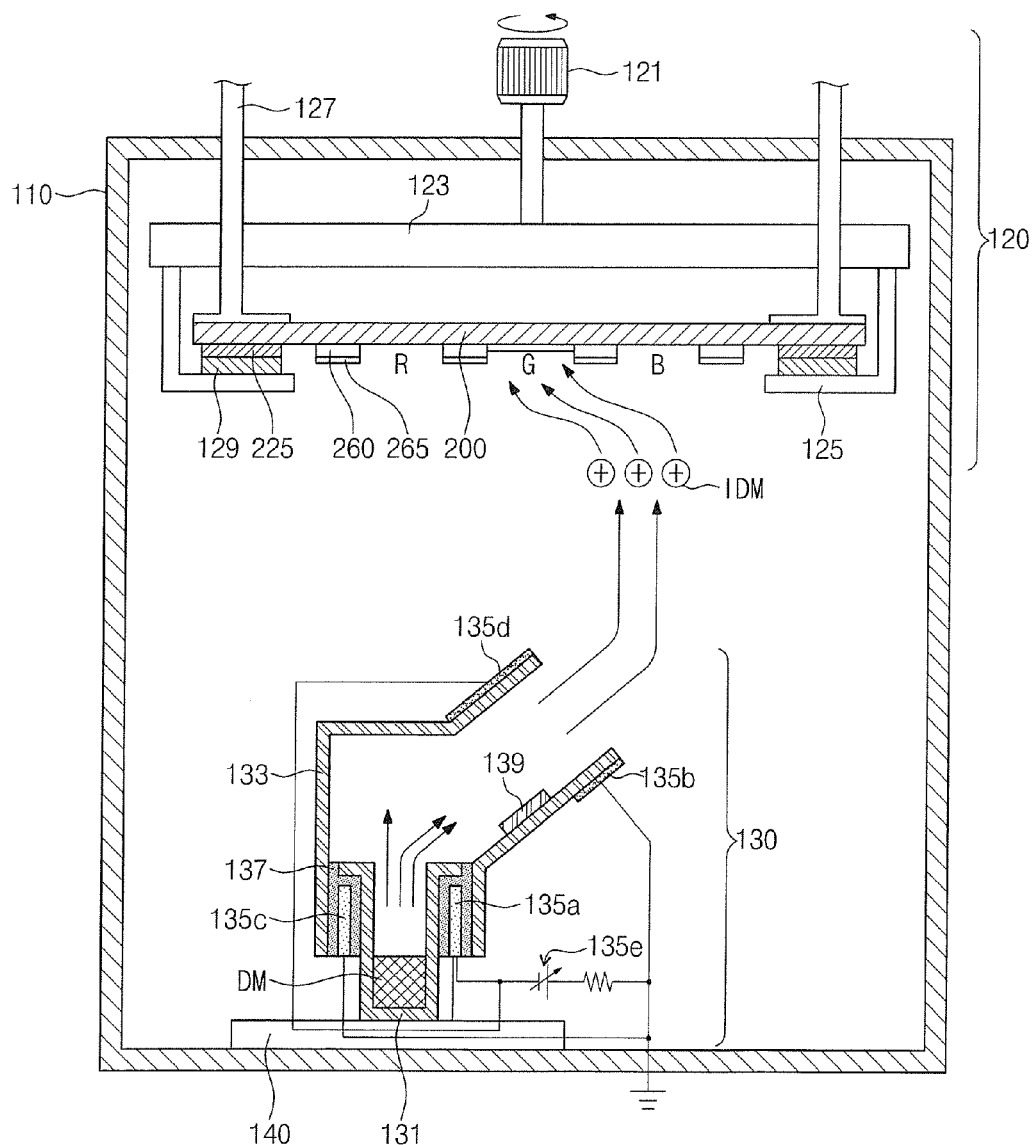
FIG. 1 is a view showing a thin layer deposition apparatus configured to perform a method of manufacturing an organic light emitting display device according to an exemplary embodiment of the present invention.

It will be understood that when an element or layer is referred to as being "on," "connected to," or "coupled to" another element or layer, it can be directly on, connected, or coupled to the other element or layer, or intervening elements or layers may be present. In contrast, when an element or layer is referred to as being "directly on," "directly connected to," or "directly coupled to" another element or layer, there are no intervening elements or layers present. Like numbers refer to like elements throughout. As used herein, the term "and/or" includes any combination of one or more of the associated listed items.

It will be understood that, although the terms first, second, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, a first element, component, region, layer, or section discussed below could be termed a second element, component, region, layer, or section without departing from the teachings of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for describing particular embodiments only and is not intended to be limiting of the invention. As used herein, the singular forms "a," "an," and "the" are intended to include the plural forms as well, unless the context clearly indicates otherwise. It will be further understood that the terms "comprise," "comprising," "includes," "including", and common variants thereof, when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, the present invention will be explained in detail with reference to the accompanying drawings.

Figure 2:
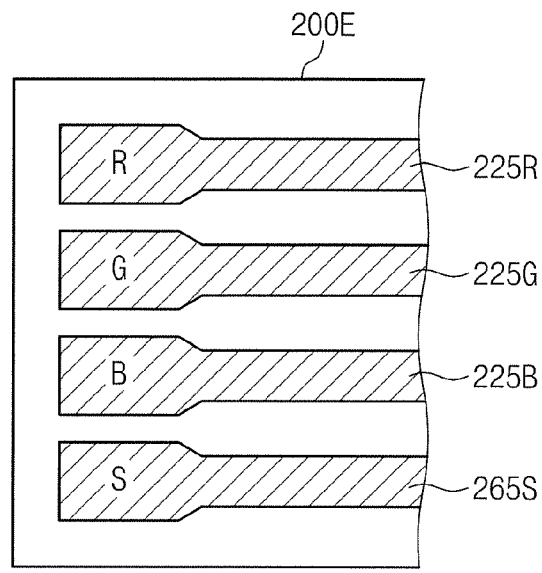
FIG. 2 is a plan view showing an arrangement of wirings of a target substrate to be processed.
Figure 3:
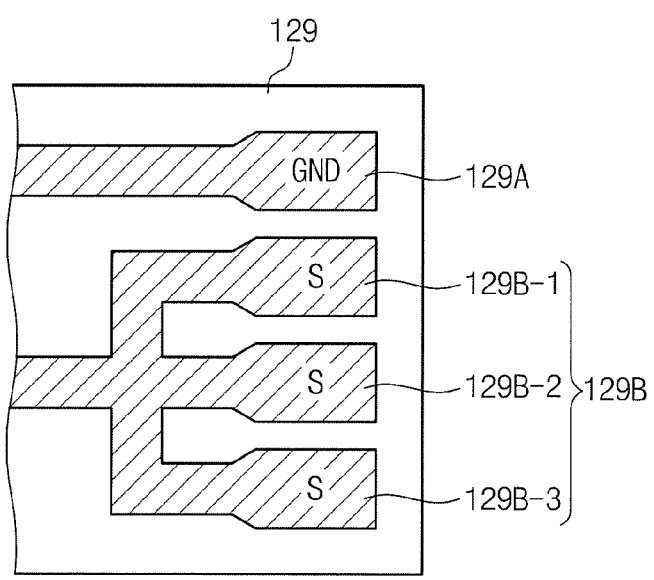
FIGS. 3 to 5 are plan views showing an arrangement of terminals of a voltage supply unit, which are connected to wirings in the thin layer deposition apparatus shown in FIG. 1.
Figure 4:
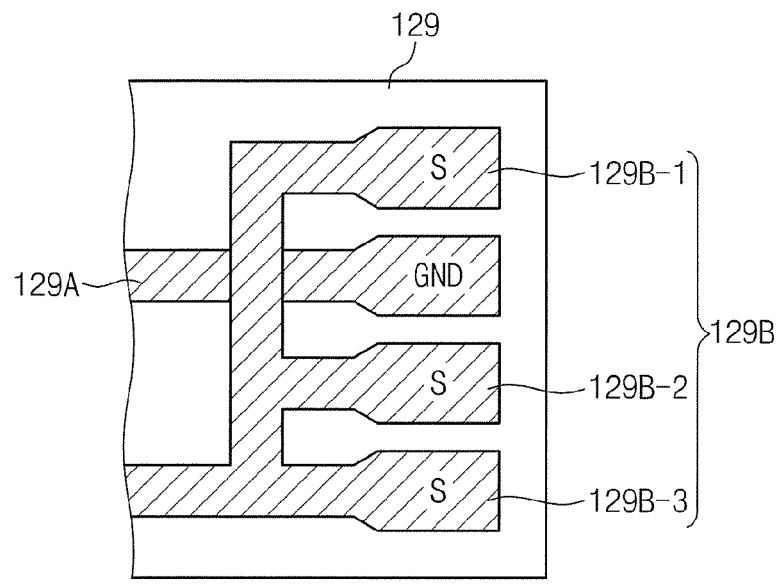
Figure 5:
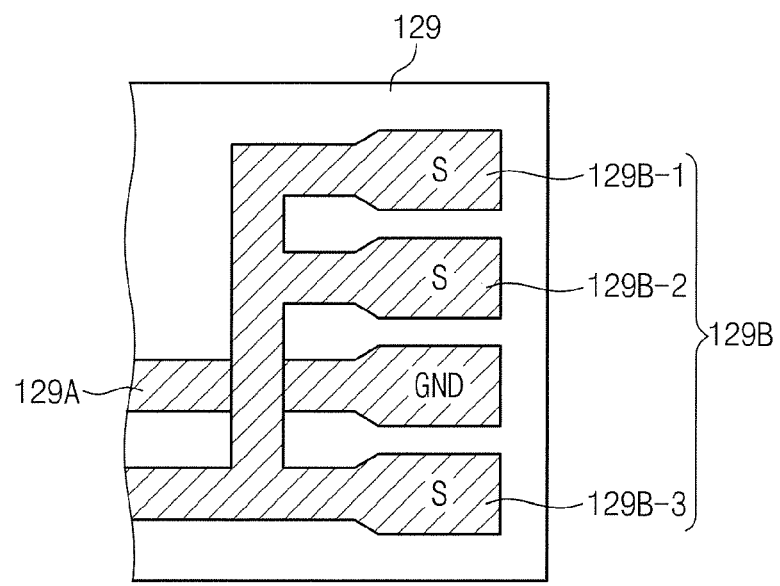

FIG. 1 is a view showing a thin layer deposition apparatus configured to perform a method of manufacturing an organic light emitting display device according to an exemplary embodiment of the present invention. FIG. 2 is a plan view showing an arrangement of wirings of a target substrate 200 to be processed. FIGS. 3 to 5 are plan views showing an arrangement of terminals of a voltage supply unit 129, which are connected to wirings in the thin layer deposition apparatus shown in FIG. 1.

Referring to FIGS. 1 to 5, the thin layer deposition apparatus includes a vacuum chamber 110 in which a vacuum environment is maintained, a substrate support unit 120 located in the vacuum chamber 110 to support a target substrate 200 on which a thin layer is deposited, and a deposition source supply unit 130 that supplies a deposition material DM to the target substrate 200. The target substrate 200 includes a plurality of sub-pixel areas R, G, and B that display different colors from each other, a pixel definition layer 260 that defines the sub-pixel areas R, G, and B, a conductive layer 265 located on the pixel definition layer 260, and a plurality of wirings 225R, 225G, 225G, and 265S located at an edge area 200E of the target substrate 200 to apply voltages to the sub-pixel areas R, G, and B, and the conductive layer 265. In the embodiment of FIGS. 1 and 2, the wirings 225R, 225G, 225B, and 265S of the target substrate 200 includes a first wiring 225R connected to a red sub-pixel area R, a second wiring 225G connected to a green sub-pixel area G, a third wiring 225B connected to a blue sub-pixel area B, and a fourth wiring 265S connected to the conductive layer 265.

The vacuum chamber 110 serves as a body of the thin layer deposition apparatus and provides a space to accommodate the substrate support unit 120 and the deposition source supply unit 130. The substrate support unit 120 includes a substrate rotation member 121 to rotate the target substrate 200, a substrate supporter 123 connected to the substrate rotation member 121, a substrate holder 125 to hold the target substrate 200 at both ends of the substrate supporter 123, a substrate fixing plate 127 facing the substrate holder 125 to fix the target substrate 200 to the substrate holder 125, and a voltage supply unit 129 located between the target substrate 200 and the substrate holder 125. The substrate fixing plate 127 may be coupled to an external driving member for the movement of the substrate fixing plate 127 in an up and down motion. In addition, the voltage supply unit 129 includes a plurality of terminals 129A and 129B connected to the wirings 225R, 225G, 225B, and 265S, and is located on a surface of the substrate holder 125, which faces the target substrate 200, to apply the voltages to the wirings 225R, 225G, 225B, and 265S of the target substrate 200.

As shown in FIGS. 3 to 5, the terminals 129A and 129B of the voltage supply unit 129 include a first terminal 129A that applies a first voltage, and a second terminal 129B that includes first, second, and third sub-terminals 129B-1, 129B-2, and 129B-3 to apply a second voltage different from the first voltage. The first voltage is a ground voltage in FIGS. 3 to 5, but may be a different voltage in other embodiments. In addition, connections between the terminals 129A and 129B, and the wirings 225R, 225G, 225B, and 265S have different shapes or configurations according to the sub-pixel areas in which the thin layer is deposited in the thin layer deposition apparatus as shown in FIGS. 3 to 5.

For instance, when the thin layer is formed in the red sub-pixel area R of the sub-pixel areas R, G, and B, as shown in FIG. 3, the first terminal 129A is connected to the first wiring 225R to apply the first voltage to the first wiring 225R. In addition, the first to third sub-terminals 129B-1, 129B-2, and 129B-3 of the second terminal 129B apply the second voltage to the second to fourth wirings 225G, 225B, and 265S, respectively.

In addition, when the thin layer is formed in the green sub-pixel area G of the sub-pixel areas R, G, and B, as shown in FIG. 4, the first terminal 129A is connected to the second wiring 225G to apply the first voltage to the second wiring 225G. In addition, the first to third sub-terminals 129B-1, 129B-2, and 129B-3 of the second terminal 129B apply the second voltage to the first wiring 225R, the third wiring 225B, and the fourth wiring 265S, respectively.

Further, when the thin layer is formed in the blue sub-pixel area B of the sub-pixel areas R, G, and B, as shown in FIG. 5, the first terminal 129A is connected to the third wiring 225B to apply the first voltage to the third wiring 225B. In addition, the first to third sub-terminals 129B-1, 129B-2, and 129B-3 of the second terminal 129B apply the second voltage to the first wiring 225R, the second wiring 225G, and the fourth wiring 265S, respectively.

The deposition source supply unit 130 is located on a separate deposition plate 140 provided in the vacuum chamber 110, and is positioned to face the target substrate 200 in the vacuum chamber 110. In addition, the deposition source supply unit 130 heats a crucible 131 formed of a metal or conductive ceramic material using an electron beam or electric resistance heat to evaporate the deposition material DM accommodated in the crucible 131.

The deposition source supply unit 130 includes the crucible 131 to accommodate and evaporate the deposition material DM, a cover 133 provided with an opening through which the evaporated deposition material DM is discharged, and an electric field generating unit. The deposition source supply unit 130 further includes a heater located outside the crucible 131 to heat the crucible 131, and a discharge plate 137 that discharges heat generated by the heater.

The cover 133 is located outside the discharge plate 137 (for example, surrounds the discharge plate 137). An electric field control unit 139 is located on an inner surface of the cover 133. The electric field control unit 139 allows the deposition material DM, which is ionized, to be discharged to the outside of the deposition source supply unit 130 without contacting the cover 133. In addition, the electric field control unit 139 controls kinetic energy of the ionized deposition material DM to control the speed of the ionized deposition material DM.

The electric field generating unit includes a first unit 135a, a second unit 135b, a third unit 135c, a fourth unit 135d, a variable power supply 135e, and a ground. The first unit 135a and the third unit 135c are located at both ends of the crucible 131. The second unit 135b and the fourth unit 135d are located at both ends of the cover 133.

The deposition source supply unit 130 further includes an ionization unit to ionize the evaporated deposition material DM. The ionization unit may be, but is not limited to, a filament located at an upper portion of the deposition source supply unit 130, and ionizes the evaporated deposition material DM in response to a voltage applied thereto. The ionized deposition material IDM is deposited on the target substrate 200 to correspond to the sub-pixel areas R, G, and B.

Figure 6:
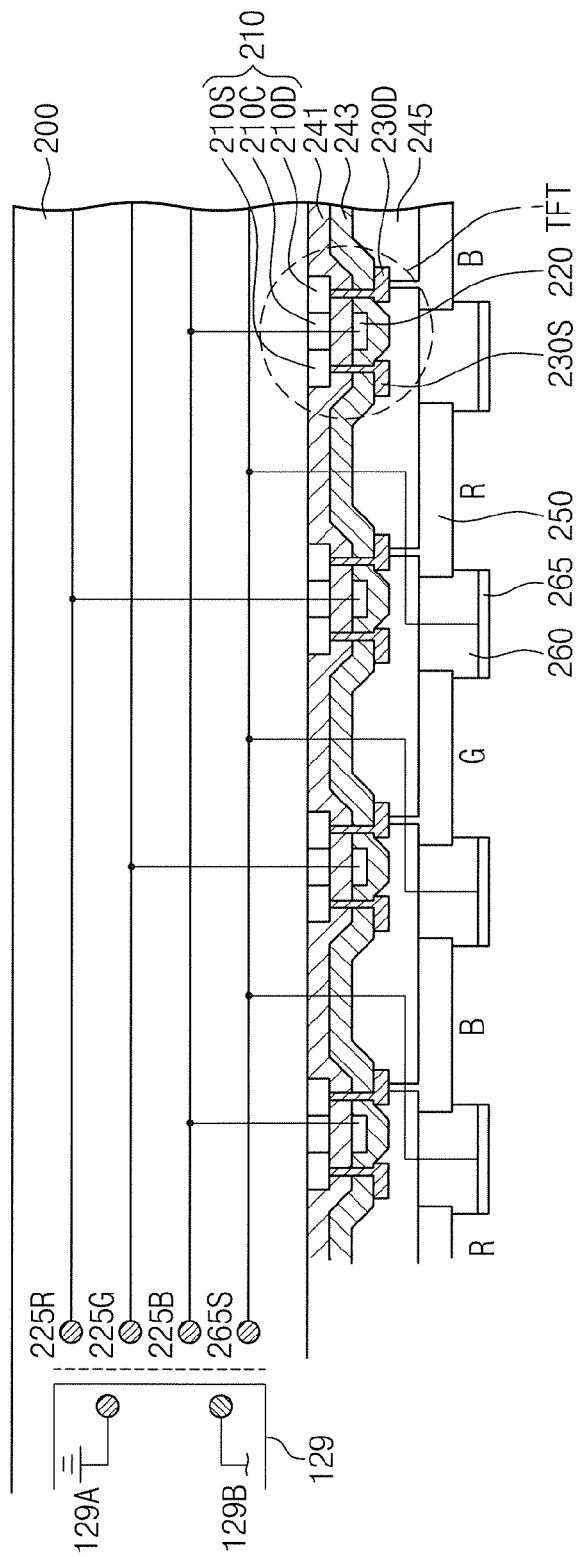
FIG. 6 is a view illustrating a voltage being applied to the target substrate in the thin layer deposition apparatus shown in FIG. 1.

FIG. 6 is a view illustrating a voltage being applied to the target substrate in the thin layer deposition apparatus shown in FIG. 1.

Referring to FIG. 6, the target substrate 200, on which the thin layer is formed in the thin layer deposition apparatus, includes the sub-pixel areas R, G, and B to display different colors. For instance, the target substrate 200 includes the red sub-pixel area R, the green sub-pixel area G, and the blue sub-pixel area B. In each of the sub-pixel areas R, G, and B, at least one thin layer transistor (for example, a thin film transistor) TFT and a pixel electrode 250 connected to the thin layer transistor TFT are arranged.

The thin layer transistor TFT includes a semiconductor layer 210, a gate electrode 220, a source electrode 230S, and a drain electrode 230D. The semiconductor layer 210 and the gate electrode 220 are insulated from each other by a gate insulating layer 241. The gate electrode 220 is insulated from the source electrode 230S and the drain electrode 230D by an inter-layer insulating layer 243. In addition, the source electrode 230S and the drain electrode 230D make contact with a source area 210S and a drain area 210D of the semiconductor layer 210, respectively. Further, an area between the source area 210S and the drain electrode 210D of the semiconductor layer 210 serves as a channel area 210C.

Meanwhile, the gate electrode 220 of each of the sub-pixel areas R, G, and B is electrically connected to a corresponding wiring of the wirings 225R, 225G, 225B, and 265S arranged in the edge area of the target substrate 200. In more detail, the gate electrode 220 of the red sub-pixel area R is electrically connected to the first wiring 225R, the gate electrode 220 of the green sub-pixel area G is electrically connected to the second wiring 225G, and the gate electrode 220 of the blue sub-pixel area B is electrically connected to the third wiring 225B.

The pixel electrode 250 is located on a protective layer 245 that protects the thin layer transistor TFT and is connected to the drain electrode 230D. The pixel electrode 250 is partially exposed through openings formed through the pixel definition layer 260. In addition, the pixel electrode 250 may include a transparent conductive oxide, e.g., indium tin oxide, indium zinc oxide, aluminum zinc oxide, gallium-doped zinc oxide, zinc tin oxide, gallium tin oxide, or fluorine-doped tin oxide.

The conductive layer 265 that includes a conductive material is located on the pixel definition layer 260. The conductive layer 265 is electrically connected to the fourth wiring 265S of the wirings 225R, 225G, 225B, and 265S. The voltages applied to the wirings 225R, 225G, 225B, and 265S, and the conductive layer 265 may be changed according to the sub-pixel areas R, G, and B in which the thin layer is formed.

For example, when the thin layer is formed in the red sub-pixel area R, the first wiring 225R electrically connected to the gate electrode 220 of the red sub-pixel area R is connected to the first terminal 129A to receive the first voltage, which may be the ground voltage. In addition, the second, third, and fourth wirings 225G, 225B, and 265, which are respectively and electrically connected to the gate electrode 220 of the green sub-pixel area G, the gate electrode 220 of the blue sub-pixel area B, and the conductive layer 265, are connected to the second terminal 129B to receive the second voltage.

In addition, when the thin layer is formed in the green sub-pixel area G, the second wiring 225G electrically connected to the gate electrode 220 of the green sub-pixel area G is connected to the first terminal 129A of the voltage supply unit 129 to receive the first voltage. In addition, the first, third, and fourth wirings 225R, 225B, and 265, which are respectively and electrically connected to the gate electrode 220 of the red sub-pixel area R, the gate electrode 220 of the blue sub-pixel area B, and the conductive layer 265, are connected to the second terminal 129B of the voltage supply unit 129 to receive the second voltage.

Further, when the thin layer is formed in the blue sub-pixel area B, the third wiring 225B electrically connected to the gate electrode 220 of the blue sub-pixel area B is connected to the first terminal 129A to receive the first voltage. In addition, the first, second, and fourth wirings 225R, 225G, and 265, which are respectively and electrically connected to the gate electrode 220 of the red sub-pixel area R, the gate electrode 220 of the green sub-pixel area G, and the conductive layer 265, are connected to the second terminal 129B to receive the second voltage.

FIGS. 7 to 10 are cross-sectional views illustrating a method of manufacturing an organic light emitting display device using the thin layer deposition apparatus shown in FIG. 1.

Figure 7:
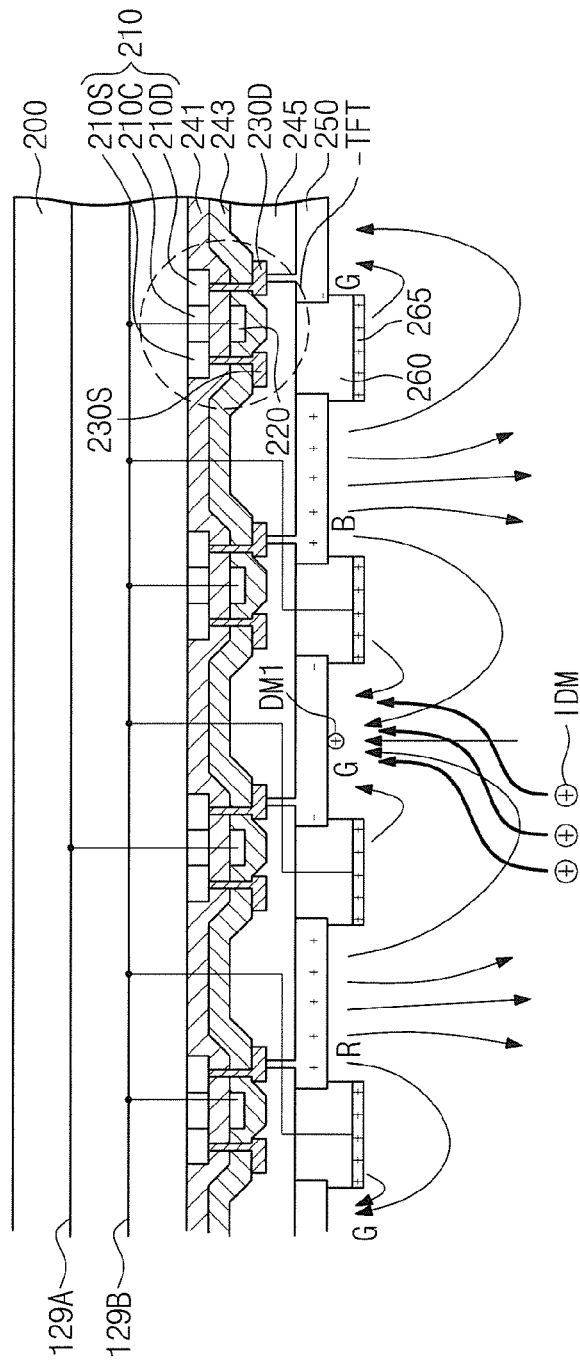
FIGS. 7 to 10 are cross-sectional views illustrating a method of manufacturing an organic light emitting display device using the thin layer deposition apparatus shown in FIG. 1.

Referring to FIG. 7, the target substrate 200 is prepared. The target substrate 200 includes the sub-pixel areas R, G, and B. The thin layer transistor TFT and the pixel electrode 250 connected to the thin layer transistor TFT are arranged in each of the sub-pixel areas R, G, and B. In addition, the conductive layer 265 is located on the pixel definition layer 260 that defines the sub-pixel areas R, G, and B.

The thin layer transistor TFT includes the semiconductor layer 210, the gate electrode 220, the source electrode 230S, and the drain electrode 230D. The pixel electrode 250 is connected to the drain electrode 230D. The gate electrode 220 of the thin layer transistor TFT and the conductive layer 265 of each sub-pixel area R, G, and B are electrically connected to the corresponding wiring of the wirings 225R, 225G, 225B, and 265S arranged in the edge area of the target substrate 200.

After preparing the target substrate 200, the target substrate 200 is transferred to the thin layer deposition apparatus shown in FIG. 1 and loaded in the thin layer deposition apparatus. Then, the ionized deposition material IDM is deposited on the pixel electrode 250 exposed through the pixel definition layer 260 in each of the sub-pixel areas R, G, and B. The order of deposition of the ionized deposition material IDM on the sub-pixel areas R, G, and B is not limited to a specific order. However, for ease of description, among the sub-pixel areas R, G, and B, the process of depositing the ionized deposition material IDM on the green sub-pixel area G prior to the red and blue sub-pixel areas will be described.

The first voltage is applied to the gate electrode 220 of the green sub-pixel area G. The first voltage may be the ground voltage. In addition, the second voltage is applied to the gate electrode 220 of the red sub-pixel area R, the gate electrode 220 of the blue sub-pixel area B, and the conductive layer 265. The second voltage has the same polarity as that of the ionized deposition material IDM. When the first voltage is applied to the gate electrode 220 of the green sub-pixel area G and the second voltage is applied to the gate electrodes 220 of the red and blue sub-pixel areas R and B, and to the conductive layer 265, the pixel electrode 250 of the green sub-pixel area G is not applied with the voltage, and the pixel electrode 250 of the red sub-pixel area R, the pixel electrode 250 of the blue sub-pixel area B, and the conductive layer 265 are applied with the voltage having the same polarity as the ionized deposition material IDM.

Thus, an electric field is generated by the pixel electrode 250 of the red sub-pixel area R, the pixel electrode 250 of the blue sub-pixel area B, and the conductive layer 265. The pixel electrode 250 of the green sub-pixel area G is polarized by the electric field generated in a portion, which is adjacent to the green sub-pixel area G, of the conductive layer 265. That is, a center area of the pixel electrode 250 of the green sub-pixel G has an opposite polarity to the polarity of the ionized deposition material IDM while the first and second voltages are applied as described above.

When the pixel electrode 250 of the green sub-pixel area G is polarized, a portion of the ionized deposition material IDM, e.g., a first deposition material DM1, moves to a surface of the pixel electrode 250 of the green sub-pixel area G. Since the first deposition material DM1 and the portion of the conductive layer 265 adjacent to the green sub-pixel area G have the same polarity, a repulsive force acts between the first deposition material DM1 and the portion of the conductive layer 265 adjacent to the green sub-pixel area G. In addition, an attractive force acts between the first deposition material DM1 and the center area of the pixel electrode 250 of the green sub-pixel area G. In this case, the repulsive force acts more strongly between the first deposition material DM1 and the portion of the conductive layer 265 adjacent to the green sub-pixel area G than the attractive force. Therefore, the first deposition material DM1 is deposited on a center portion of the pixel electrode 250 of the green sub-pixel area G.

Figure 8:
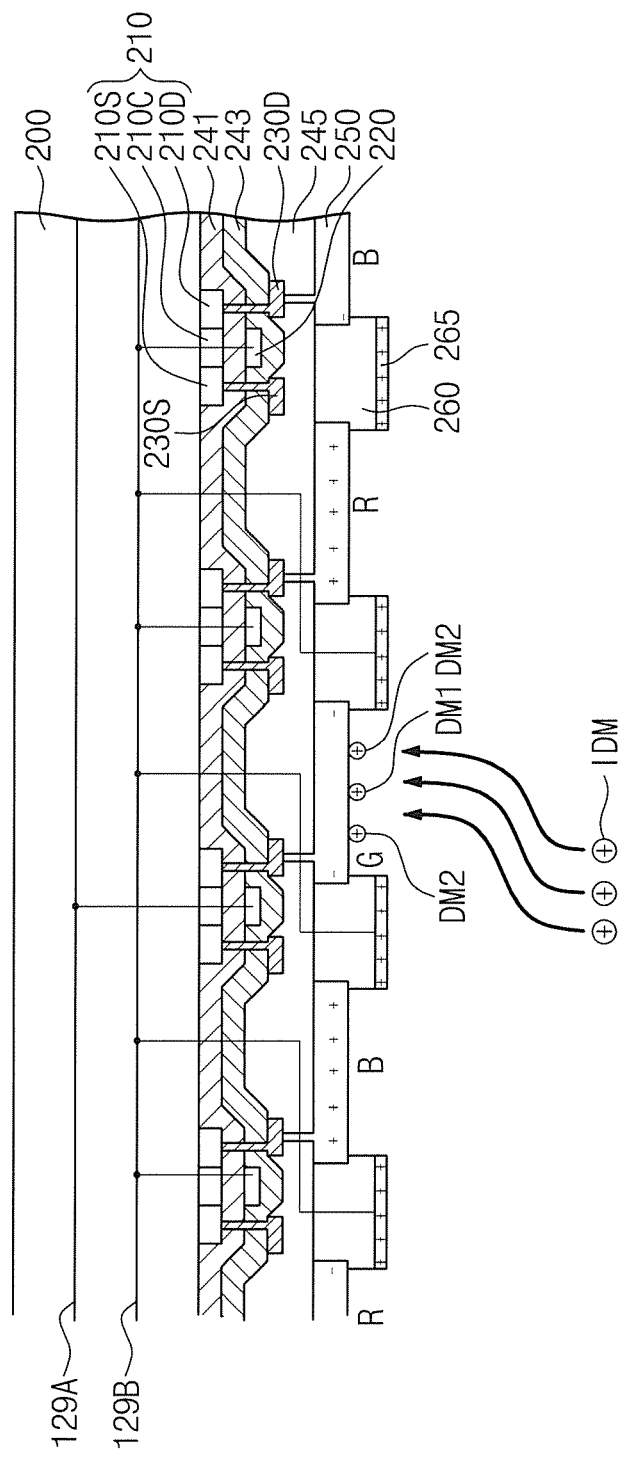

Referring to FIG. 8, when the first deposition material DM1 is deposited on the center portion of the pixel electrode 250 of the green sub-pixel area G, the pixel electrode 250 of the green sub-pixel area G is polarized again. When the pixel electrode 250 of the green sub-pixel area G is polarized again, another portion of the ionized deposition material IDM, e.g., a second deposition material DM2, moves to the pixel electrode 250 of the green sub-pixel area G.

In this case, the repulsive force acts between the second deposition material DM2 and the portion of the conductive layer 265 adjacent to the green sub-pixel area G, and between the first deposition material DM1 and the second deposition material DM2. Accordingly, due to the repulsive forces, the second deposition material DM2 is deposited between the first deposition material DM1 and the edge area of the pixel electrode 250 of the green sub-pixel area G.

Figure 9:
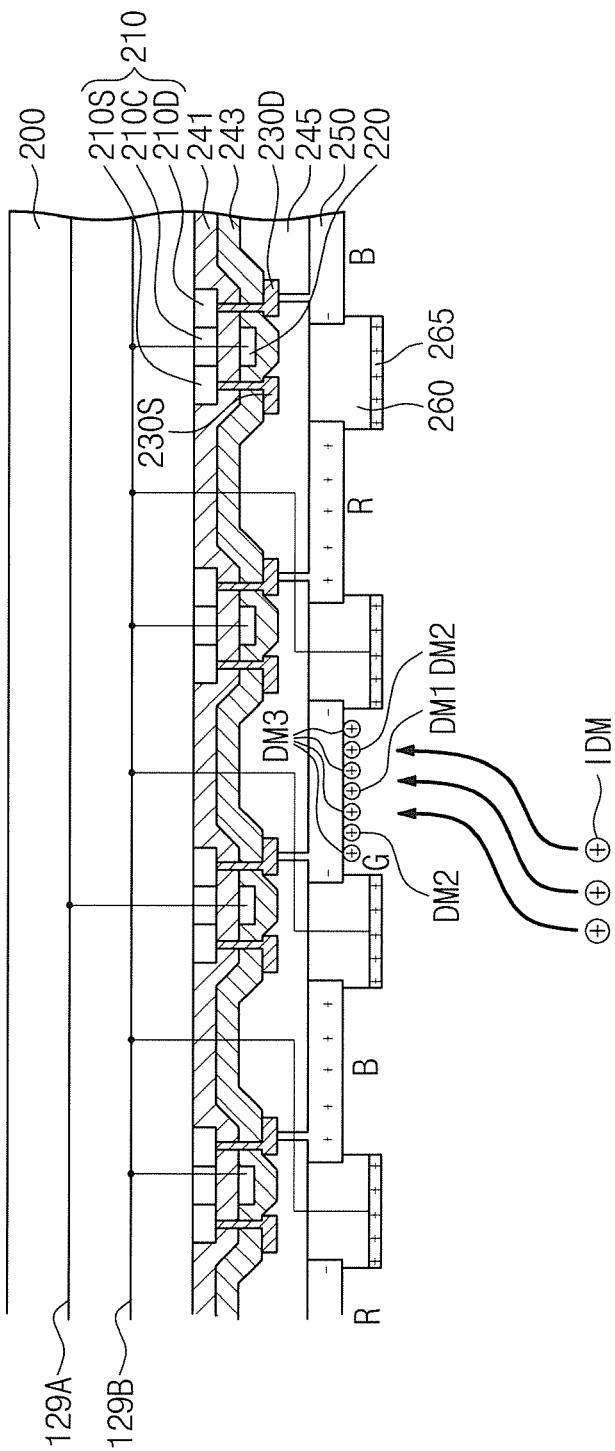

Referring to FIG. 9, when the second deposition material DM2 is deposited between the first deposition material DM1 and the edge area of the pixel electrode 250 of the green sub-pixel area G, the pixel electrode 250 of the green sub-pixel area G is polarized again. When the pixel electrode 250 of the green sub-pixel area G is polarized again, another portion of the ionized deposition material IDM, e.g., a third deposition material DM3, moves to the pixel electrode 250 of the green sub-pixel area G.

In this case, the repulsive force acts between the third deposition material DM3 and the portion of the conductive layer 265 adjacent to the green sub-pixel area G, between the first deposition material DM1 and the third deposition material DM3, and between the second deposition material DM2 and the third deposition material DM3. Accordingly, due to the repulsive forces, the third deposition material DM3 is deposited between the second deposition material DM2 and the edge area of the pixel electrode 250 of the green sub-pixel area G, and between the first deposition material DM1 and the second deposition material DM2.

As described above, when the polarization of the pixel electrode 250 and the deposition of the ionized deposition material IDM are repeated, the ionized deposition material IDM is deposited on the surface of the pixel electrode 250 to fill an empty area on the surface of the pixel electrode 250. Accordingly, the organic thin layer is formed with a uniform thickness.

Figure 10:
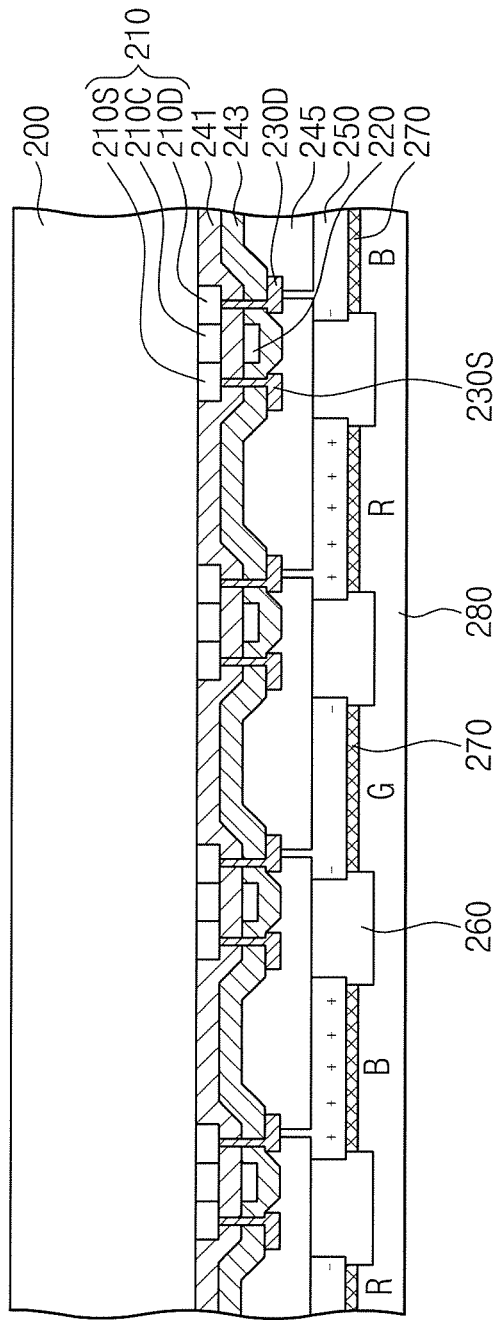

Referring to FIG. 10, the organic thin layer 270 is formed in the red sub-pixel area R and the blue sub-pixel area B after the organic thin layer 270 is formed in the green sub-pixel area G. When the organic thin layer 270 is formed in each of the sub-pixel areas R, G, and B, the conductive layer 265 is removed. When the conductive layer is removed, an opposite electrode 280 is formed to cover the organic thin layer 270 and the pixel definition layer 260. The opposite electrode 280 may reflect the light and include at least one of Mo, MoW, Cr, Al, AlNd, or Al, which has a work function lower than that of the pixel electrode 250. Then, a sealing process is performed after the opposite electrode 280 is formed and thus, the organic light emitting display device is manufactured.

Although exemplary embodiments of the present invention have been described, it is understood that the present invention should not be limited to these exemplary embodiments. Rather, various changes and modifications can be made by one of ordinary skill in the art within the spirit and scope of the present invention as hereinafter claimed in the appended claims, and their equivalents.

What is claimed is:

1. A method of manufacturing an organic light emitting display device, comprising:
   preparing a target substrate that comprises:
      a plurality of sub-pixel areas each comprising
         a thin film transistor comprising a gate electrode,
         a first wiring electrically connected to the gate electrode, and
         a pixel electrode connected to the thin film transistor; and
      a plurality of pixel defining areas between the sub-pixel areas, each comprising
         a pixel definition layer,
         a conductive layer on the pixel definition layer, and
         a second wiring electrically connected to the conductive layer;
   preparing an ionized deposition material by vaporizing and ionizing a deposition material;
   applying a ground voltage to the first wiring of one of the sub-pixel areas while applying a voltage having a same polarity as the ionized deposition material to the first wiring of neighboring ones of the sub-pixel areas and to the second wiring of the pixel defining areas; and
   depositing the ionized deposition material on the pixel electrode of the one of the sub-pixel areas to form an organic thin layer while the pixel electrode of the one of the sub-pixel areas is polarized by an electric field generated by the voltage being applied to the conductive layer of the pixel defining areas,
   wherein the depositing of the ionized deposition material comprises:
      depositing a first portion of the ionized deposition material on a center area of the pixel electrode of the one of the sub-pixel areas by using a repulsive force acting between the ionized deposition material and the conductive layer;
      depositing a second portion of the ionized deposition material on an area between the deposited first portion and an edge area of the pixel electrode of the one of the sub-pixel areas by using the repulsive force acting between the ionized deposition material and the conductive layer, and a repulsive force acting between the ionized deposition material and the deposited first portion; and
      depositing a third portion of the ionized deposition material on an area between the deposited second portion and the edge area of the pixel electrode of the one of the sub-pixel areas, and on an area between the deposited first portion and the deposited second portion using repulsive forces acting between the ionized deposition material and the deposited first portion, the deposited second portion, and the conductive layer.

2. The method of claim 1, wherein
   the sub-pixel areas comprise a red sub-pixel area, a green sub-pixel area, and a blue sub-pixel area, and
   the one of the sub-pixel areas comprises one of the red sub-pixel area, the green sub-pixel area, or the blue sub-pixel area.

3. The method of claim 1, further comprising removing the conductive layer after the organic thin layer is formed.

4. A method of manufacturing an organic light emitting display device, comprising:
   preparing a target substrate that comprises a plurality of sub-pixel areas and a conductive layer between the sub-pixel areas;
   applying a first voltage to one of the sub-pixel areas while applying a second voltage different from the first voltage to neighboring ones of the sub-pixel areas and to the conductive layer, to generate an electric field to polarize the one of the sub-pixel areas; and
   depositing an ionized deposition material having a same polarity as the second voltage on the one of the sub-pixel areas to form an organic thin layer, the depositing of the ionized deposition material comprising:
      depositing a first portion of the ionized deposition material on a center area of the one of the sub-pixel areas using a repulsive force acting between the ionized deposition material and the conductive layer;
      depositing a second portion of the ionized deposition material on an area between the deposited first portion and an edge area of the one of the sub-pixel areas by using the repulsive force acting between the ionized deposition material and the conductive layer, and a repulsive force acting between the ionized deposition material and the deposited first portion; and
      depositing a third portion of the ionized deposition material on an area between the deposited second portion and the edge area of the one of the sub-pixel areas, and on an area between the deposited first portion and the deposited second portion using repulsive forces acting between the ionized deposition material and the deposited first portion, the deposited second portion, and the conductive layer.

5. The method of claim 4, wherein the first voltage is a ground voltage.

6. The method of claim 5, wherein
   each of the sub-pixel areas comprises
      a thin film transistor comprising a gate electrode, and a pixel electrode connected to the thin film transistor, the applying of the first voltage to the one of the sub-pixel areas comprises applying the first voltage to the gate electrode of the thin film transistor in the one of the sub-pixel areas, and the applying of the second voltage to the neighboring ones of the sub-pixel areas comprises applying the second voltage to the gate electrode of the thin film transistor in each of the neighboring sub-pixel areas.

7. The method of claim 6, wherein the sub-pixel areas are defined by a pixel definition layer, and the conductive layer is on the pixel definition layer.

8. The method of claim 4, further comprising removing the conductive layer after the organic thin layer is formed.

* * * * *